United States Patent
Saito

(10) Patent No.: US 10,345,102 B2
(45) Date of Patent: Jul. 9, 2019

(54) METHOD FOR EVALUATING WARPAGE OF WAFER AND METHOD FOR SORTING WAFER

(71) Applicant: SHIN-ETSU HANDOTAI CO., LTD., Tokyo (JP)

(72) Inventor: Hisayuki Saito, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 304 days.

(21) Appl. No.: 15/305,222

(22) PCT Filed: Mar. 12, 2015

(86) PCT No.: PCT/JP2015/001372
§ 371 (c)(1),
(2) Date: Oct. 19, 2016

(87) PCT Pub. No.: WO2015/166623
PCT Pub. Date: Nov. 5, 2015

(65) Prior Publication Data
US 2017/0038202 A1 Feb. 9, 2017

(30) Foreign Application Priority Data

May 1, 2014 (JP) ................................ 2014-094469

(51) Int. Cl.
*G01B 21/20* (2006.01)
*G03F 7/20* (2006.01)
(Continued)

(52) U.S. Cl.
CPC ............ *G01B 21/20* (2013.01); *G01B 21/30* (2013.01); *G03F 7/20* (2013.01); *G03F 7/70633* (2013.01);
(Continued)

(58) Field of Classification Search
None
See application file for complete search history.

(56) References Cited

U.S. PATENT DOCUMENTS 5,978,071 A 11/1999 Miyajima et al.
6,975,960 B2 * 12/2005 Kobayashi ............. G01B 11/24
438/14
(Continued)

FOREIGN PATENT DOCUMENTS

CN 1612290 A 5/2005
CN 101442018 A * 5/2009
(Continued)

OTHER PUBLICATIONS

Thakur et al., "Effects of wafer bow and warpage on the integrity of thin gate oxides" Appl. Phys. Lett. 64 (25), Jun. 20, 1994.*
(Continued)

*Primary Examiner* — John C Kuan
(74) *Attorney, Agent, or Firm* — Oliff PLC

(57) ABSTRACT

A method for evaluating warpage of a wafer, includes measuring the warpage of the wafer that is in a free state without suction and determining, from measured warpage data, a wafer warpage amount A between two points $Q^1$ and $Q^2$ and a wafer warpage amount B between two points $R^1$ and $R^2$, the points $Q^1$ and $Q^2$ being located on a straight line passing through an arbitrary point P in a wafer plane and a distance "a" away from the point P, the points $R^1$ and $R^2$ being located on the same straight line and a distance "b" away from the point P, the distance "b" differing from the distance "a", calculating, from the wafer warpage amount A and the wafer warpage amount B, a difference in wafer warpage amount at the point P, and evaluating the warpage on the basis of the difference in wafer warpage amount.

16 Claims, 7 Drawing Sheets

(51) Int. Cl.
  *H01L 21/66* (2006.01)
  *G01B 21/30* (2006.01)
  *H01L 21/67* (2006.01)
(52) U.S. Cl.
  CPC .......... *G03F 7/70783* (2013.01); *H01L 22/12* (2013.01); *G01B 2210/56* (2013.01); *H01L 21/67288* (2013.01)

(56) References Cited

U.S. PATENT DOCUMENTS

| | | |
|---|---|---|
| 2005/0093101 A1 | 5/2005 | Matsumoto |
| 2006/0286710 A1* | 12/2006 | Sugita ................. G02B 6/13 438/106 |
| 2008/0113171 A1* | 5/2008 | Nakai .................. C30B 15/206 428/218 |
| 2008/0286885 A1 | 11/2008 | Izikson et al. |
| 2013/0082279 A1* | 4/2013 | Faurie ................ H01L 21/3245 257/76 |
| 2014/0287538 A1 | 9/2014 | Inoue et al. |

FOREIGN PATENT DOCUMENTS

| | | |
|---|---|---|
| CN | 102254855 A | 11/2011 |
| CN | 102394225 A | 3/2012 |
| JP | H06-204115 A | 7/1994 |
| JP | H11-204419 A | 7/1999 |
| JP | H11-265844 A | 9/1999 |
| JP | 2009-027095 A | 2/2009 |
| JP | 2010-118487 A | 5/2010 |
| JP | 2010-537394 A | 12/2010 |
| JP | 2011-214910 A | 10/2011 |
| JP | 2013-120820 A | 6/2013 |
| TW | 2012 09374 A | 3/2012 |
| TW | 2013 40228 A | 10/2013 |

OTHER PUBLICATIONS

Jul. 27, 2017 Search Report issued in Chinese Patent Application No. 2015800205396.
May 2, 2017 Search Report issued in Taiwanese Patent Application No. 104108261.
Jun. 16, 2015 Search Report issued in International Patent Application No. PCT/JP2015/001372.

* cited by examiner

METHOD FOR EVALUATING WARPAGE OF WAFER AND METHOD FOR SORTING WAFER

TECHNICAL FIELD

The present invention relates to a method for evaluating warpage of a wafer, and a method for sorting a wafer with the same.

BACKGROUND ART

When devices such as semiconductor devices and liquid crystal devices are manufactured by photolithography technique, a pattern of an original plate (hereinafter, also referred to as a mask) is conventionally transferred by photo exposure through a projection optical system to a photosensitive substrate (hereinafter, also referred to as a wafer) on which a photosensitive agent is applied.

In recent years, the devices have been more integrated, and fine processing technologies for the photosensitive substrate have accordingly been more developed. The fine processing technologies mainly use exposure apparatuses such as a mirror projection aligner, a stepper, and a scanner. The mirror projection aligner is an equal-magnification projection exposure apparatus configured to performing expose while scanning the original plate and the photosensitive substrate with an equal-magnification mirror optical system having an arc-shaped exposure region. The stepper is a reduction projection exposure apparatus configured to form a pattern image of the original plate on the photosensitive substrate by dioptric system and expose the photosensitive substrate by step-and-repeat system. The scanner is a reduction projection exposure apparatus configured to expose the photosensitive substrate while scanning the photosensitive substrate with synchronized scanning of the original plate.

The exposure is performed by overlapping a mask on a wafer. The exposure of the wafer with the stepper can cause alignment error, so-called overlay failure, due to multiple exposure shots. To prevent the overlay failure, many apparatuses and methods have been proposed.

Patent Document 1 proposes a projection exposure apparatus configured to align a mask pattern image with a certain region on a wafer every shot to form the mask pattern on the wafer, in which a wafer stage is moved to a predetermined position every shot by stepping movement. Patent Document 2 proposes a method for performing exposure after fine alignment every shot. In these documents, positions of the second and later shots are determined in accordance with a pattern position of the first shot. In practice, however, these techniques check a part of alignment marks and, if the checked mark is correctly positioned, omit alignment in the rest shots. Thus, there are problems of insufficient prevention of the overlay failure.

To solve such problems, Patent Document 3 proposes a method in which alignment is performed every one shot. This document proposes that the alignment is performed by die-by-die alignment. However, the alignment every one shot is complicated and thus has a problem of reduction in productivity.

In addition, these documents could not find out the cause of the overlay failure.

CITATION LIST

Patent Literature

Patent Document 1: Japanese Unexamined Patent publication (Kokai) No. H06-204115

Patent Document 2: Japanese Unexamined Patent publication (Kokai) No. H11-204419

Patent Document 3: Japanese Unexamined Patent publication (Kokai) No. H11-265844

SUMMARY OF INVENTION

Technical Problem

The wafer shape is mainly divided into flatness and warpage. The flatness is a surface shape when the back surface is flattened, i.e., unevenness of thickness; whereas the warpage is a surface shape in a free state when the back surface is not sucked.

Conventionally, the flatness is regarded as more important on wafers used in a photolithography process. The reason is that the warpage is corrected during exposure by sucking the wafer on a stage, and the flatness is regarded as just the surface shape.

The stepper typically sucks the wafer by vacuum suction. As shown in FIG. 6(a), the stage 2 for sucking the wafer 1 is composed of recesses for drawing the wafer under vacuum and protrusions (pin chucks) 3 for holding the wafer. It was considered that the warpage is corrected by sucking the wafer 1 with the flat pin chucks 3, and the shape of the back surface is flattened along the pin chucks.

In practice, however, warpage having a period (width) equal to or less than the pitch of the pin chucks 3 cannot be corrected even by suction, and thus the wafer back surface is not completely flatten, as shown in FIG. 6(b). The suction merely corrects warpage at a portion where the pin chucks are in contact with the wafer back surface; this portion varies depending on the stepper. In other words, a way of correcting the wafer shape varies depending on the individual stepper.

The shape and the pitch of the pin chucks in the stepper reflect know-how of makers and vary depending on the makers and development timing. Furthermore, the device-makers properly use various steppers by mix-and-match. Thus, some different steppers are used in the photolithography process to produce one device.

The photolithography process with the back surface being always flatten allows the wafer shape to be corrected similarly in every process; thus, the pattern is not distorted even if the wafer warps. In practice, however, steppers having different pin chuck pitches are necessarily used for each process as mentioned above. This variation in stepper makes the way of correcting the wafer shape different depending on each process. Consequently, a wiring shaped in a straight line at the beginning and the wafer shape are distorted, resulting in the overlay failure.

The present invention was accomplished in view of the above-described problems. It is an object of the present invention to induce a novel parameter indicative of variation in correct degree of warpage caused by different pin chuck pitches when a wafer is sucked, and provide a method for evaluating warpage of a wafer by using this parameter. Another object is to provide a method for sorting a wafer that does not cause the overlay failure in the photolithography process, with the above evaluation method.

Solution To Problem

To achieve the object, the present invention provides a method for evaluating warpage of a wafer, comprising the steps of:

(1) measuring the warpage of the wafer that is in a free state without suction; and (2) determining, from measured data of the warpage of the wafer, a wafer warpage amount A between two points $Q^1$ and $Q^2$ and a wafer warpage amount B between two points $R^1$ and $R^2$, the points $Q^1$ and $Q^2$ being located on a straight line passing through an arbitrary point P in a wafer plane and a distance "a" away from the point P, the points $R^1$ and $R^2$ being located on the same straight line and a distance "b" away from the point P, the distance "b" differing from the distance "a", calculating, from the wafer warpage amount A and the wafer warpage amount B, a difference in wafer warpage amount at the point P, and evaluating the warpage of the wafer on the basis of the difference in wafer warpage amount.

Such an evaluation method induces, on the basis of the warpage of the wafer that is in a free state without suction, a novel parameter indicative of variation in correct degree of warpage caused by different pin chuck pitches when the wafer is sucked. The warpage of the wafer can be evaluated by using this parameter.

It is preferred that the distance "a" and the distance "b" range from 0.5 to 12.5 mm, and the distance "a" minus the distance "b" be 5 mm or more.

Such distances enable calculation of the difference in wafer warpage amount that more greatly reflects variations in pin chuck pitch and wafer warpage.

The wafer warpage amounts can be determined from a height of a front surface of the wafer at the point P, assuming that a height of a back surface of the wafer is 0 at two points a certain distance away from the point P.

Additionally, calculating the difference in wafer warpage amount preferably includes calculating differences in wafer warpage amount at least at a plurality of arbitrary points on an X-axis and a Y-axis perpendicularly intersecting at a center of the wafer plane.

This allows the warpage of the entire wafer surface to be more precisely evaluated.

Furthermore, the present invention provides a method for sorting a wafer, comprising determining a relationship between a difference in wafer warpage amount calculated by the above method for evaluating warpage of a wafer and the presence of an occurrence of overlay failure in a photolithography process, and sorting a wafer without the overlay failure on the basis of the relationship.

Such a sorting method facilitates sorting of a wafer that does not cause the overlay failure in the photolithography process.

Advantageous Effects of Invention

As mentioned above, the inventive method for evaluating warpage of a wafer induces, on the basis of the warpage of the wafer that is in a free state without suction, a novel parameter indicative of variation in correct degree of warpage caused by different pin chuck pitches when the wafer is sucked. The warpage of the wafer can be evaluated by using this parameter. Furthermore, a wafer without the overlay failure can be easily sorted by determining a relationship between the difference in wafer warpage amount calculated by the inventive evaluation method and the presence of an occurrence of overlay failure in the photolithography process.

BRIEF DESCRIPTION OF DRAWINGS

FIG. 4-1 is a graph showing measurement results of warpage of the entire wafer in Sample 1 of examples of the present invention;

FIG. 4-2 is a graph showing measurement results of warpage of the entire wafer in Sample 2 of examples of the present invention;

FIG. 4-3 is a graph showing measurement results of warpage of the entire wafer in Sample 3 of examples of the present invention;

FIG. 5-1 is a graph on which calculation results of pin chuck warpage (20/10 and 20/5) in Sample 1 of examples of the present invention are plotted;

FIG. 5-2 is a graph on which calculation results of pin chuck warpage (20/10 and 20/5) in Sample 2 of examples of the present invention are plotted;

FIG. 5-3 is a graph on which calculation results of pin chuck warpage (20/10 and 20/5) in Sample 3 of examples of the present invention are plotted;

DESCRIPTION OF EMBODIMENTS

As mentioned above, the problem of the overlay failure has recently arisen in the photolithography process with the stepper. The prevention of the overlay failure is thus demanded.

The present inventor has focused on the shape of wafers used in the photolithography process and found that, although it was conventionally considered that the wafer back surface is flattened by the back surface suction in the photolithography process, the back surface is not completely flattened in practice.

The reason is that while wafer warpage having a longer period (width) than the pitch of pin chucks can be corrected by suction, wafer warpage having a shorter period than the pitch of pin chucks cannot be corrected by suction.

Figure 7:
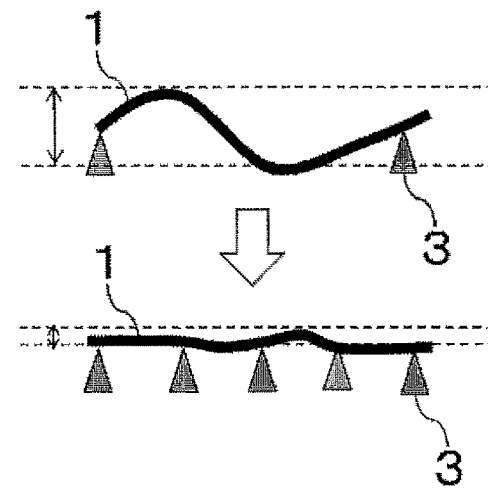
FIG. 7 is an explanatory diagram showing a relationship between the pin chuck pitch and the way of correcting the wafer shape.

Specifically, the photolithography process with steppers having different pin chuck pitches causes portions where the warpage is corrected and where the warpage is not corrected. This variation makes the way of correcting the shape of the wafer 1 different depending on the pitch of the pin chucks 3, as shown in FIG. 7. In other words, the pattern is extended or contracted according to the shape of the warpage.

Figure 8:
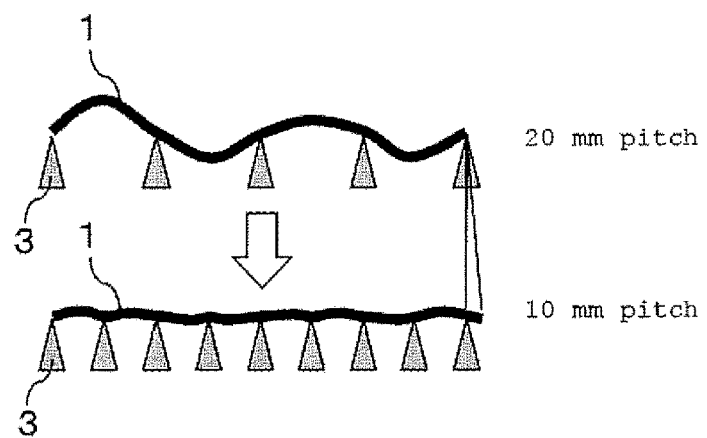
FIG. 8 is an explanatory diagram showing a relationship between the pin chuck pitch and the extension of the wafer.

As shown in FIG. 8, for example, the shape of the wafer 1 corrected by suction with pin chucks 3 having a pitch of 10 mm is flatter than that of the wafer 1 corrected by suction with pin chucks 3 having a pitch of 20 mm, thus having a larger area in a top development view; i.e., a phenomenon corresponding to the deformation of the wafer 1 occurs. This phenomenon is considered to cause the overlay failure.

Figure 9:
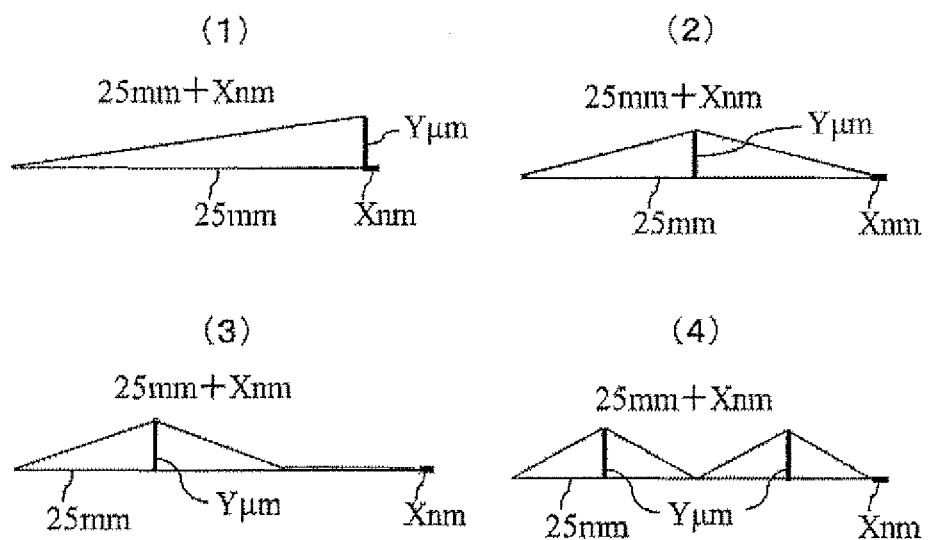
FIG. 9 is an explanatory diagram showing a relationship between an extension amount X when the wafer is sucked and a wafer warpage amount Y.

Assuming changes of wafer warpage amount and extension amount when the wafer is sucked as shown in FIG. 9, warpage amount that causes the overlay failure is calculated. In FIG. 9, X denotes the extension amount, and Y denotes the warpage amount.

It is said that latest device chips have a minimum circuit width of 20 to 10 nm. Assuming that the overlay failure occurs on a wafer that is extended or contracted by an equivalent or half or more amount of this width, wafer warpage amounts when the wafer is extended by 20 nm, 10 nm, and 5 nm are estimated.

(1) In case of no suction→suction with pin chucks having 25 mm pitch

| Extension amount X | Wafer warpage amount Y |
|---|---|
| 20 nm | 32 μm |
| 10 nm | 22 μm |
| 5 nm | 16 μm |

(2) In case of changing from pin chucks having 25 mm pitch to pin chucks having 12.5 mm pitch

| Extension amount X | Wafer warpage amount Y |
|---|---|
| 20 nm | 16 μm |
| 10 nm | 11 μm |
| 5 nm | 7.9 μm |

(3) In case of changing from pin chucks having 25 mm pitch to pin chucks having 8.3 mm pitch

| Extension amount X | Wafer warpage amount Y |
|---|---|
| 20 nm | 13 μm |
| 10 nm | 9.1 μm |
| 5 nm | 6.5 μm |

(4) In case of changing from pin chucks having 25 mm pitch to pin chucks having 6.25 mm pitch

| Extension amount X | Wafer warpage amount Y |
|---|---|
| 20 nm | 7.9 μm |
| 10 nm | 5.6 μm |
| 5 nm | 4.0 μm |

In practice, warpage has a complicated shape. It is thus considered that warpage whose amount is smaller than the above calculated amount also causes the overlay failure. What matters is, as shown by the above calculation results, several μm of roughness in the 25 mm pitch can lead to an extension of 5 nm or more, which is seemingly the cause of the overlay failure.

In view of this, the inventor found that when the wafer is sucked with steppers having different pin chuck pitches, the wafer having a small variation in correct degree of warpage due to the different pin chuck pitches is hard to cause the overlay failure. The inventor then found that the wafer warpage correlated to the overlay failure can be evaluated by inducing a novel parameter indicative of variation in correct degree of warpage caused by the different pin chuck pitches, thereby bringing the present invention to completion.

That is, the present invention is a method for evaluating warpage of a wafer, comprising the steps of:
(1) measuring the warpage of the wafer that is in a free state without suction; and
(2) determining, from measured data of the warpage of the wafer, a wafer warpage amount A between two points $Q^1$ and $Q^2$ and a wafer warpage amount B between two points $R^1$ and $R^2$, the points $Q^1$ and $Q^2$ being located on a straight line passing through an arbitrary point P in a wafer plane and a distance "a" away from the point P, the points $R^1$ and $R^2$ being located on the same straight line and a distance "b" away from the point P, the distance "b" differing from the distance "a", calculating, from the wafer warpage amount A and the wafer warpage amount B, a difference in wafer warpage amount at the point P, and evaluating the warpage of the wafer on the basis of the difference in wafer warpage amount.

Hereinafter, the present invention will be described in detail, but the present invention is not limited thereto.

Figure 1:
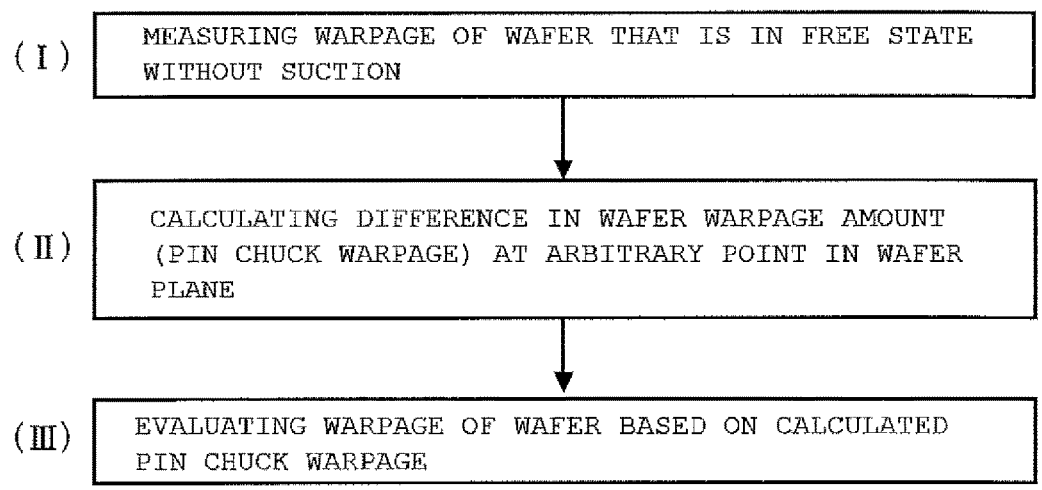
FIG. 1 is a flow chart of an exemplary method for evaluating warpage of a wafer according to the present invention.

FIG. 1 is a flow chart of an exemplary method for evaluating warpage of a wafer according to the present invention.

In the inventive method for evaluating warpage of a wafer, firstly, (I) the warpage of the wafer that is in a free state without suction is measured, as the step (1). Secondly, (II) the difference in wafer warpage amount (hereinafter, also referred to as pin chuck warpage) at an arbitrary point in a wafer plane is calculated, as the step (2). Finally, (III) the warpage of the wafer is evaluated on the basis of the calculated pin chuck warpage.

Each step will be described in detail below.

(Step (1))

In the step (1) of the inventive method for evaluating warpage of a wafer, the warpage of the wafer that is in a free state without suction is measured (FIG. 1(I)).

The wafer may be for example, but is not particularly limited to, a silicon single crystal wafer usually used in the photolithography process. Such a wafer can be preferably used in the present invention.

The warpage of the wafer may be measured with known apparatus and method capable of measuring warpage of a wafer that is in a free state without suction.

(Step (2))

In the step (2) of the inventive method for evaluating warpage of a wafer, a wafer warpage amount A between two points $Q^1$ and $Q^2$ and a wafer warpage amount B between two points $R^1$ and $R^2$ are determined from data of the warpage of the wafer measured in the step (1). Herein, the points $Q^1$ and $Q^2$ is located on a straight line passing through an arbitrary point P in a wafer plane and a distance "a" away from the point P. The points $R^1$ and $R^2$ is located on the same straight line and a distance "b", which differs from the distance "a", away from the point P. A difference in wafer warpage amount (pin chuck warpage) at the point P is then calculated from the wafer warpage amount A and the wafer warpage amount B (FIG. 1(II)).

A procedure for calculating the pin chuck warpage will be now described in more detail with reference to FIG. 2.

First, the wafer warpage amount A between two points $Q^1$ and $Q^2$ is determined (see FIG. 2(i)). The points $Q^1$ and $Q^2$ are located on the straight line passing through the arbitrary point P in the wafer plane, and there is a distance "a" between each point and the central point P.

Figure 2:
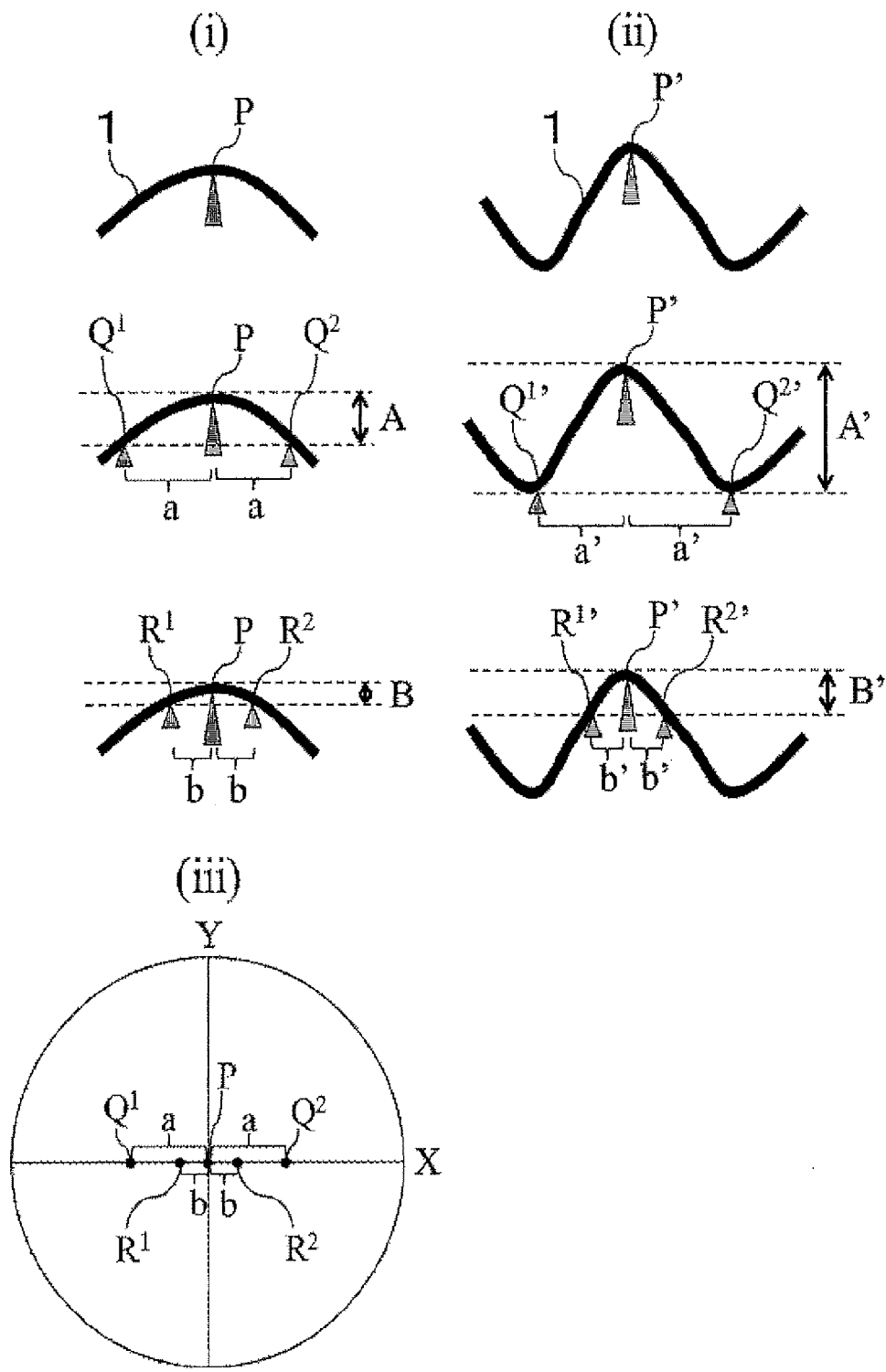
FIG. 2 is an explanatory diagram showing an exemplary procedure for calculating pin chuck warpage in the method for evaluating warpage of a wafer according to the present invention.

The wafer warpage amount A can be determined, for example as shown in FIG. 2, from a height (shown by the arrow in the figure) of the wafer front surface at the point P, assuming that a height of the wafer back surface is 0 at the two points $Q^1$ and $Q^2$ the distance "a" away from the point P.

The wafer warpage amount A may be determined assuming that a height of the wafer front surface is 0 at the two points $Q^1$ and $Q^2$, or may be determined from a height of the wafer back surface at the point P. The wafer warpage amount A and the wafer warpage amount B, which is described later, are determined on the same basis.

Then, the wafer warpage amount B between two points $R^1$ and $R^2$ is determined (see FIG. 2(*i*)). The points $R^1$ and $R^2$ are collinear with the points P, $Q^1$ and $Q^2$, and there is a distance "b" between each point and the central point P, which differs from the distance "a".

The wafer warpage amount B can be determined in the same manner as the wafer warpage amount A.

Then, the difference in wafer warpage amount (pin chuck warpage) at the point P is calculated from the wafer warpage amount A and the wafer warpage amount B determined above (see FIG. 2(*iii*)).

The pin chuck warpage is calculated as follows:

Pin Chuck Warpage=(Wafer Warpage Amount *A*)−(Wafer Warpage Amount *B*)

Herein, a pin chuck pitch is often written after the pin chuck warpage.

This pitch is expressed as "pin chuck warpage 2*a*/2*b*" since the distance (2*a*) between the two points $Q^1$ and $Q^2$ and the distance (2*b*) between the two points $R^1$ and $R^2$ correspond to the pin chuck pitches. For example, when the distance "a" is 10 mm and the distance "b" is 5 mm, the pin chuck warpage is expressed as "pin chuck warpage 20/10".

A wafer with small pin chuck warpage as shown in FIG. 2(*i*), which has a shape smoothly changed with a long period, is hard to change its surface even if the wafer is sucked with pin chucks, for example, with 20 mm pitch or 5 mm pitch. Thus, even if the wafer has a large warpage amount as a whole, the overlay failure is hard to occur. By contrast, a wafer with large pin chuck warpage as shown in FIG. 2(*ii*), which has a shape changed with a short period, significantly changes its surface shape due to the different pitches, thus easily causing the overlay failure.

It is preferred that the distance "a" and the distance "b" range from 0.5 to 12.5 mm, and the distance "a" minus the distance "b" be 5 mm or more.

Such distances assumes the case of a pin chuck pitch of 1 to 25 mm for application to current steppers and scanners mainly using a shot area of 35×25 mm. The distance "a" and the distance "b" are of course not limited to this range.

When the distance "a" minus the distance "b" is 5 mm or more, the difference between the $Q^1$-$Q^2$ distance and the $R^1$-$R^2$ distance (i.e., the difference in pin chuck pitch) is large. Consequently, the pin chuck warpage that more greatly reflects the wafer warpage can be calculated.

Additionally, calculating the pin chuck warpage preferably includes calculating pin chuck warpages at least at a plurality of arbitrary points on an X-axis and a Y-axis perpendicularly intersecting at a center of the wafer plane. The calculation of pin chuck warpage at multiple arbitrary points on the X-axis and the Y-axis allows the warpage of the entire wafer surface to be more precisely evaluated. Moreover, pin chuck warpage on a straight line oblique to the X-axis and the Y-axis may be calculated.

Figure 3:
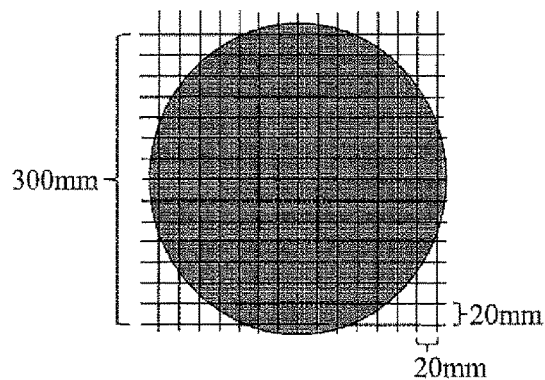
FIG. 3 is an explanatory diagram showing an example of calculating pin chuck warpage over the entire wafer surface in the method for evaluating warpage of a wafer according to the present invention.

When the pin chuck warpage is calculated over the entire wafer surface, the warpage of the entire wafer surface can be more precisely evaluated. In this case, the pin chuck warpage is preferably calculated on vertical and horizontal straight lines having an interval of 1 to 20 mm. FIG. 3 shows an example of calculating the pin chuck warpage on vertical and horizontal straight lines having an interval of 20 mm over the entire wafer surface.

When the pin chuck warpage is calculated at multiple collinear points, the wafer warpage can be more precisely evaluated by calculating the pin chuck warpage, for example, at an interval of 1 mm. Of course, the interval is not limited to 1 mm, and any other interval may be used.

The inventive evaluation method will be more specifically described below.

1. The warpage of the wafer that is in a free state is measured.
2. The pin chuck warpage at an arbitrary point is determined:
   The warpage amount caused between the pin chucks when the wafer back surface is sucked with the stepper is determined from the warpage of the wafer in a free state without suction measured in the step 1.
3. Assuming that the back surface height is 0 at both side points 10 mm away from an arbitrary point on the X-axis and the Y-axis (the case of 20 mm interval; i.e., a=10 mm) and the wafer shape is not changed, the front surface height (wafer warpage amount) A at the arbitrary point is determined.
4. Assuming that the back surface height is 0 at both side points 2.5 mm away from the arbitrary point (the case of 5 mm interval; i.e., b=2.5 mm), the front surface height (wafer warpage amount) B at the arbitrary point is likewise determined.
5. The steps 3 and 4 are repeated with 1 mm pitch to determine wafer warpage amounts over the entire x-axis and Y-axis.
6. The difference between the height A and the height B at the point is expressed as pin chuck warpage 20/5. The higher this value, the larger the difference due to the change of pin chuck pitch. That is, it is evaluated that the wafer having the higher value more easily causes the overlay failure (FIG. 1(III)).

Furthermore, the present invention provides a method for sorting a wafer, comprising determining a relationship between a difference in wafer warpage amount calculated by the above method for evaluating warpage of a wafer and the presence of an occurrence of overlay failure in a photolithography process, and sorting a wafer without the overlay failure on the basis of the relationship.

Such a sorting method facilitates sorting of a wafer that does not cause the overlay failure in the photolithography process.

As described above, the inventive method for evaluating warpage of a wafer induces, on the basis of the warpage of the wafer that is in a free state without suction, a novel parameter indicative of variation in correct degree of warpage caused by different pin chuck pitches when the wafer is sucked. The warpage of the wafer can be evaluated by using this parameter. Furthermore, a wafer without the overlay failure can be easily sorted by determining a relationship between the difference in wafer warpage amount calculated by the inventive evaluation method and the presence of an occurrence of overlay failure in the photolithography process.

EXAMPLE

Hereinafter, the present invention will be more specifically described with reference to examples, but the present invention is not limited thereto.

EXAMPLE

Figures 1, 4:
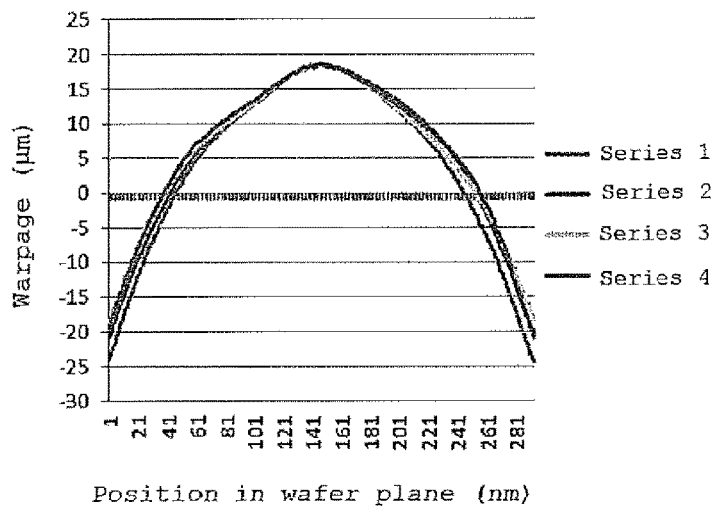
Figures 2, 4:
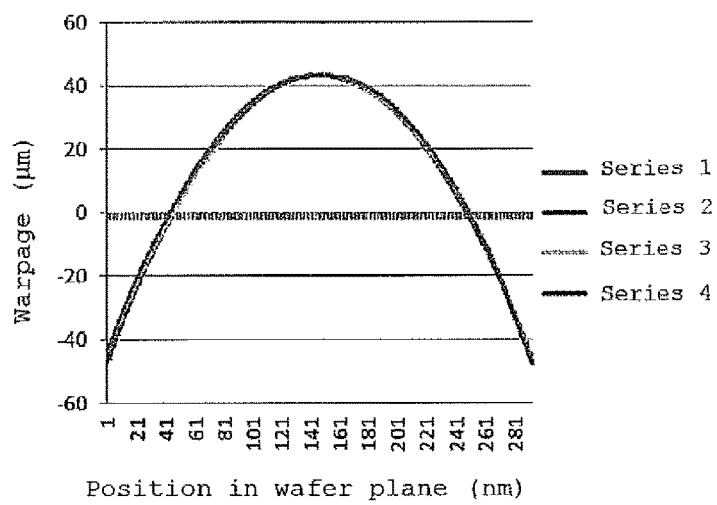
Figures 3, 4:
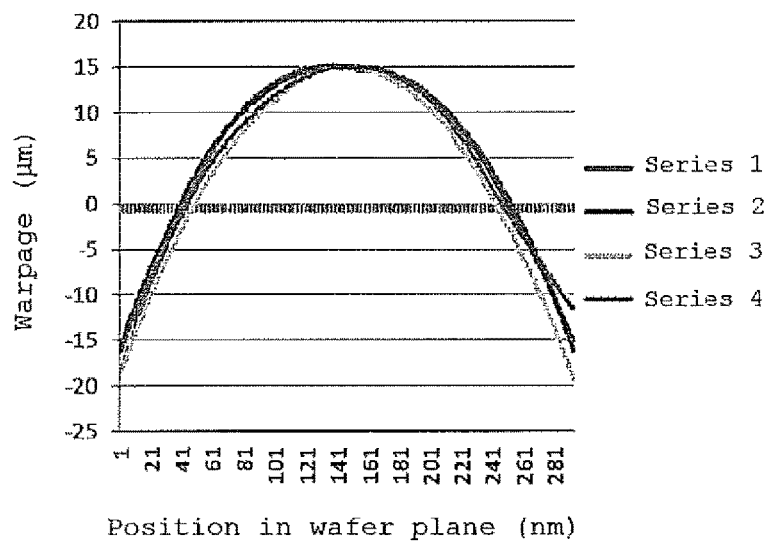

Three silicon wafers having a diameter of 300 mm were prepared (the respective wafers are referred to as Samples 1 to 3). The warpage of each wafer that is in a free state without suction was measured by SBW330, manufactured by KOBELCO research institute. Inc. The warpage of the wafer was measured on 4 lines (the X-axis, the Y-axis and straight lines oblique to the X-axis and the Y-axis) passing through the center of the wafer. FIGS. 4-1 to 4-3 show the measurement results.

As shown in FIG. 4-1, the warpage of the entire wafer of Sample 1 is about −24 to 18 μm. As shown in FIG. 4-2, the warpage of the entire wafer of Sample 2 is about −45 to 45 μm. As shown in FIG. 4-3, the warpage of the entire wafer of Sample 3 is about −18 to 15 μm.

Then, pin chuck warpage 20/10 and pin chuck warpage 20/5 were calculated on Samples 1 to 3, which have been subjected to the above wafer warpage measurement. The pin chuck warpage was calculated at an interval of 1 mm from one end to the other of a straight line passing through a notch and the center of the wafer.

Figures 1, 5:
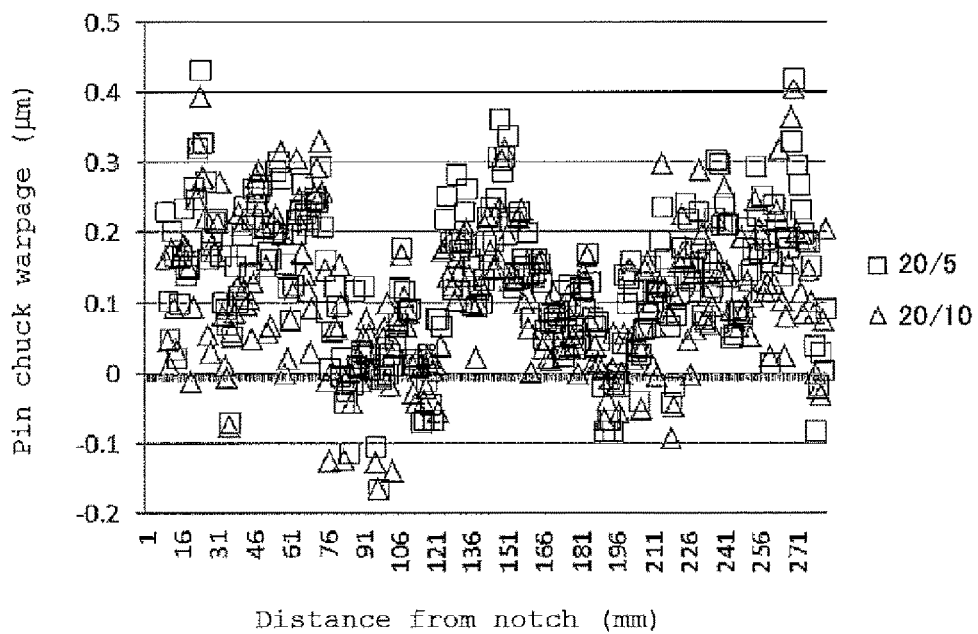
Figures 2, 5:
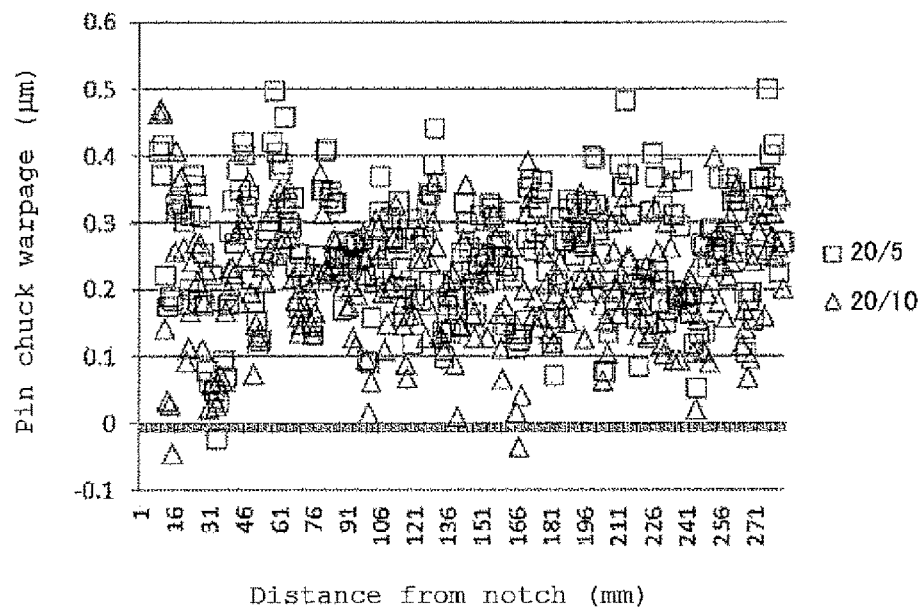
Figures 3, 5:
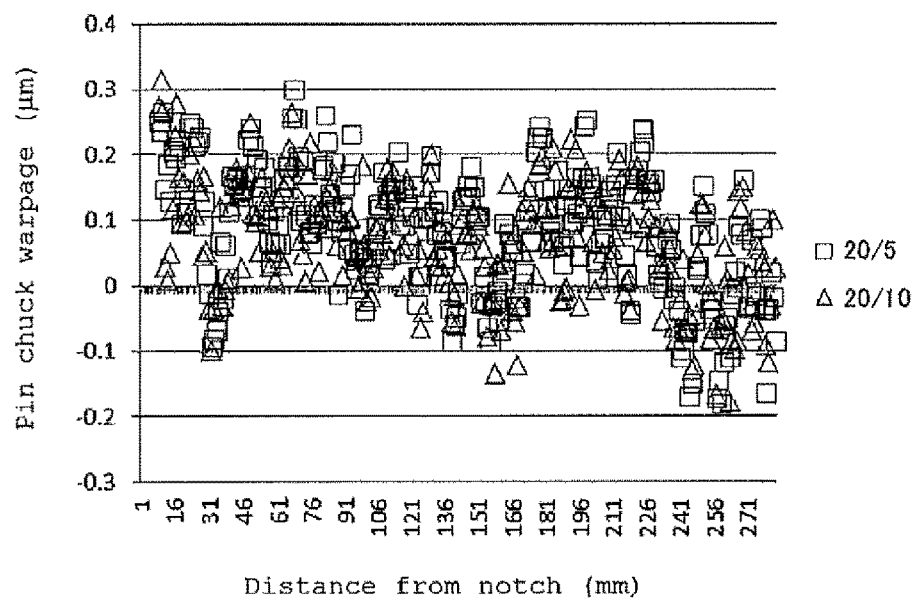
Figure 6:
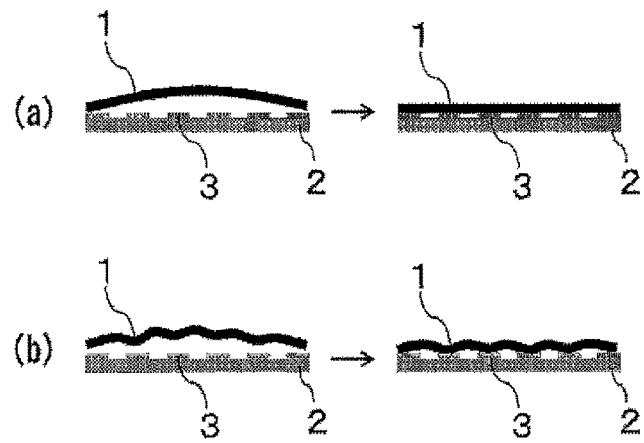
FIG. 6 is an explanatory diagram showing the wafer shape when the wafer is sucked with pin chucks.

FIGS. 5-1 to 5-3 show the calculated pin chuck warpage 20/10 and pin chuck warpage 20/5 of Samples 1 to 3.

As shown in FIG. 5-1, the pin chuck warpage 20/10 and pin chuck warpage 20/5 of Sample 1 was about 0.45 μm or less in an absolute value. As shown in FIG. 5-2, the pin chuck warpage 20/10 and pin chuck warpage 20/5 of Sample 2 was about 0.50 μm or less in an absolute value. As shown in FIG. 5-3, the pin chuck warpage 20/10 and pin chuck warpage 20/5 of Sample 3 was about 0.30 μm or less in an absolute value.

Then, the photolithography process was practically performed with Samples 1 to 3. As a result, Sample 1 and Sample 2 caused the overlay failure, while Sample 3 did not cause the overlay failure.

As described above, although the warpage of the entire wafer of Sample 2 is larger than those of the other two samples, the warpages of the entire wafers of Sample 1 and Sample 3 were almost the same. This indicates the difficulty in sorting a wafer that does not cause the overlay failure (Sample 3) from the warpage of the entire wafers.

By contrast, the evaluation method using the pin chuck warpage induced in the inventive evaluation method can distinguish Sample 3, which has small pin chuck warpage, from Samples 1 and 2, which have large pin chuck warpage, as described above. Thus, this method facilitates sorting of a wafer that does not cause the overlay failure (Sample 3).

As described above, it was revealed that the inventive evaluation method can evaluate the wafer warpage correlated to the overlay failure by inducing a novel parameter indicative of variation in correct degree of warpage caused by different pin chuck pitches when the wafer is sucked, thus facilitating sorting of a wafer that does not cause the overlay failure on the basis of the calculated difference in wafer warpage amount.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for selecting a wafer that will not cause overlay failure when used in a photolithography device, the method comprising the steps of:

measuring warpage of the wafer that is in a free state without suction;

determining, from measured data of the warpage of the wafer, a wafer warpage amount A between two points $Q^1$ and $Q^2$, the points $Q^1$ and $Q^2$ being located (i) on a straight line passing through an arbitrary point P in a wafer plane, and (ii) a distance "a" away from the point P;

determining, from the measured data of the warpage of the wafer, a wafer warpage amount B between two points $R^1$ and $R^2$, the points $R^1$ and $R^2$ being located (i) on the same straight line, and (ii) a distance "b" away from the point P, the distance "b" differing from the distance "a";

calculating, from the determined wafer warpage amount A and the determined wafer warpage amount B, a pin chuck warpage of the wafer, the pin chuck warpage being a difference in wafer warpage amount at the point P;

determining whether the wafer will cause overlay failure based on the calculated pin chuck warpage; and upon a determination that the wafer will not cause overlay failure, selecting the wafer to be used in the photolithography device.

2. The method according to claim 1, wherein the distance "a" and the distance "b" range from 0.5 to 12.5 mm, and the distance "a" minus the distance "b" is 5 mm or more.

3. The method according to claim 1, wherein the wafer warpage amounts are determined from a height of a front surface of the wafer at the point P, assuming that a height of a back surface of the wafer is 0 at two points a certain distance away from the point P.

4. The method according to claim 2, wherein the wafer warpage amounts are determined from a height of a front surface of the wafer at the point P, assuming that a height of a back surface of the wafer is 0 at two points a certain distance away from the point P.

5. The method according to claim 1, wherein calculating the pin chuck warpage includes calculating differences in wafer warpage amount at least at a plurality of arbitrary points on an X-axis and a Y-axis perpendicularly intersecting at a center of the wafer plane.

6. The method according to claim 2, wherein calculating the pin chuck warpage includes calculating differences in wafer warpage amount at least at a plurality of arbitrary points on an X-axis and a Y-axis perpendicularly intersecting at a center of the wafer plane.

7. The method according to claim 3, wherein calculating the pin chuck warpage includes calculating differences in wafer warpage amount at least at a plurality of arbitrary points on an X-axis and a Y-axis perpendicularly intersecting at a center of the wafer plane.

8. The method according to claim 4, wherein calculating the pin chuck warpage includes calculating differences in wafer warpage amount at least at a plurality of arbitrary points on an X-axis and a Y-axis perpendicularly intersecting at a center of the wafer plane.

9. The method according to claim 1, wherein determining whether the wafer will cause overlay failure based on the calculated pin chuck warpage includes: determining a relationship between pin chuck warpage and a presence of an occurrence of overlay failure.

10. The method according to claim 2, wherein determining whether the wafer will cause overlay failure based on the calculated pin chuck warpage includes: determining a relationship between pin chuck warpage and a presence of an occurrence of overlay failure.

11. The method according to claim 3, wherein determining whether the wafer will cause overlay failure based on the calculated pin chuck warpage includes: determining a relationship between pin chuck warpage and a presence of an occurrence of overlay failure.

12. The method according to claim 4, wherein determining whether the wafer will cause overlay failure based on the calculated pin chuck warpage includes: determining a relationship between pin chuck warpage and a presence of an occurrence of overlay failure.

13. The method according to claim 5, wherein determining whether the wafer will cause overlay failure based on the calculated pin chuck warpage includes: determining a relationship between pin chuck warpage and a presence of an occurrence of overlay failure.

14. The method according to claim 6, wherein determining whether the wafer will cause overlay failure based on the calculated pin chuck warpage includes: determining a relationship between pin chuck warpage and a presence of an occurrence of overlay failure.

15. The method according to claim 7, wherein determining whether the wafer will cause overlay failure based on the calculated pin chuck warpage includes: determining a relationship between pin chuck warpage and a presence of an occurrence of overlay failure.

16. The method according to claim 8, wherein determining whether the wafer will cause overlay failure based on the calculated pin chuck warpage includes: determining a relationship between pin chuck warpage and a presence of an occurrence of overlay failure.

* * * * *